(12) United States Patent
Felix et al.

(10) Patent No.: US 11,699,592 B2
(45) Date of Patent: Jul. 11, 2023

(54) INVERSE TONE PILLAR PRINTING METHOD USING ORGANIC PLANARIZING LAYER PILLARS

(71) Applicant: International Business Machines Corporation, Armonk, NY (US)

(72) Inventors: Nelson Felix, Singerlands, NY (US); Ekmini Anuja De Silva, Singerlands, NY (US); Praveen Joseph, Albany, NY (US); Ashim Dutta, Menands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/467,428

(22) Filed: Sep. 6, 2021

(65) Prior Publication Data
US 2021/0398816 A1 Dec. 23, 2021

Related U.S. Application Data

(62) Division of application No. 16/400,003, filed on Apr. 30, 2019, now Pat. No. 11,133,195.

(51) Int. Cl.
*H01L 21/308* (2006.01)
*H01L 21/033* (2006.01)

(52) U.S. Cl.
CPC ...... *H01L 21/3086* (2013.01); *H01L 21/0332* (2013.01); *H01L 21/0337* (2013.01);
(Continued)

(58) Field of Classification Search
CPC .............. H01L 21/3086; H01L 21/0332; H01L 21/0337; H01L 21/0338; H01L 21/3081; H01L 21/3088
See application file for complete search history.

(56) References Cited

U.S. PATENT DOCUMENTS 7,192,868 B2  3/2007 Cotte et al.
7,790,350 B2  9/2010 Breyta et al.
(Continued)

OTHER PUBLICATIONS

Hubert Hody et al., "Double patterning with dual hard mask for 28-nm node devices and below," Journal of Micro/Nanolithography, MEMS, and MOEMS, vol. 12, No. 4, 2013, 041306, 5 pp.
(Continued)

*Primary Examiner* — Michael Jung
(74) *Attorney, Agent, or Firm* — Joseph P. Curcuru; Otterstedt & Kammer PLLC (57) ABSTRACT

An initial semiconductor structure includes an underlying substrate, a hard mask stack, an organic planarization layer (OPL), a first complementary material, and a patterned photoresist layer patterned into a plurality of photoresist pillars defining a plurality of photoresist trenches. The first material is partially etched inward of the trenches, to provide trench regions, and the photoresist is removed. The trench regions are filled with a second complementary material, preferentially etchable with respect to the first material. A polymer brush is grafted on the second material but not the first material, to form polymer brush regions with intermediate regions not covered by the brush. The first material is anisotropically etched the at the intermediate regions but not the brush regions. The OPL is etched inward of the intermediate regions, to provide a plurality of OPL pillars defining a plurality of OPL trenches inverted with respect to the photoresist pillars.

9 Claims, 9 Drawing Sheets

(52) U.S. Cl.
CPC ...... *H01L 21/0338* (2013.01); *H01L 21/3081* (2013.01); *H01L 21/3088* (2013.01)

(56) References Cited

U.S. PATENT DOCUMENTS

| | | | |
|---|---|---|---|
| 8,836,082 | B2 | 9/2014 | Lin et al. |
| 9,455,177 | B1 | 9/2016 | Park et al. |
| 9,728,406 | B2 | 8/2017 | Dai et al. |
| 10,032,640 | B1 | 7/2018 | Huang et al. |
| 10,043,656 | B1 | 8/2018 | Smith et al. |
| 10,515,803 | B1 | 12/2019 | Lin et al. |
| 2008/0220193 | A1* | 9/2008 | Tohi .................... C08J 5/18 526/348 |
| 2010/0040838 | A1 | 2/2010 | Abdallah et al. |
| 2014/0038412 | A1 | 2/2014 | Hu et al. |
| 2015/0024597 | A1 | 1/2015 | Gao et al. |
| 2016/0042965 | A1 | 2/2016 | Ha et al. |
| 2016/0047961 | A1 | 2/2016 | Park et al. |
| 2016/0133477 | A1 | 5/2016 | Trefonas, III et al. |
| 2016/0358776 | A1 | 12/2016 | Guillom et al. |
| 2017/0170008 | A1 | 6/2017 | Park et al. |
| 2017/0294310 | A1 | 10/2017 | Tapily et al. |
| 2017/0342553 | A1 | 11/2017 | Yu et al. |
| 2018/0337044 | A1 | 11/2018 | Wang et al. |
| 2019/0064667 | A1 | 2/2019 | Glodde et al. |
| 2019/0318958 | A1 | 10/2019 | Bristol et al. |
| 2020/0058502 | A1 | 2/2020 | Chen et al. |
| 2020/0350177 | A1 | 11/2020 | Felix |

OTHER PUBLICATIONS

Wikipedia, Extreme ultraviolet lithography, downloaded Apr. 17, 2019 from https://en.wikipedia.org/wiki/Extreme_ultraviolet_lithography, pp. 1-35.

Paul J. Otterstedt, Sep. 6, 2021, pp. 1-2, List of IBM Patents or Patent Applications Treated as Related.

* cited by examiner

INVERSE TONE PILLAR PRINTING METHOD USING ORGANIC PLANARIZING LAYER PILLARS

CROSS-REFERENCE TO RELATED APPLICATIONS

This application is a divisional of U.S. patent application Ser. No. 16/400,003 filed Apr. 30, 2019, now U.S. Pat. No. 11,133,195, the complete disclosure of which is expressly incorporated herein by reference in its entirety for all purposes.

BACKGROUND

The present invention relates to the electrical and electronic arts, and more specifically, to semiconductor fabrication techniques and the like.

Various aspects of semiconductor fabrication require the lithographic patterning of pillar and/or trench features. There are a number of issues with regard to the current state of the art as it relates to the use of EUV (Extreme Ultraviolet) lithography.

Due to the small sizes and "brightfield" nature of the lithography, printing pillars with a positive-tone resist in EUV leads to unacceptably-high pattern distortion, number of defects, and collapse. Furthermore, direct print of a trench in the sub-32 nm-pitch regime has process limitations due to resist scumming that forms microbridges.

BRIEF SUMMARY

Embodiments of the present invention provide techniques for inverse tone pillar printing.

According to an embodiment of the present invention, an exemplary method includes providing an initial semiconductor structure including an underlying substrate, a hard mask stack outward of the underlying substrate, an organic planarization layer outward of the hard mask stack, a first complementary material outward of the organic planarization layer, and a patterned photoresist layer outward of the first complementary material, wherein the patterned photoresist layer is patterned into a plurality of photoresist pillars defining a plurality of photoresist trenches. Further steps include partially etching the first complementary material inward of the trenches, to provide first complementary material trench regions in the first complementary material; removing the patterned photoresist layer; and filling the trench regions in the first complementary material with a second complementary material, wherein the second complementary material is preferentially etchable with respect to the first complementary material. Even further steps include grafting a polymer brush on the second complementary material but not the first complementary material, to form polymer brush regions with intermediate regions of first complementary material not covered by the polymer brush; anisotropically etching the first complementary material at the intermediate regions but not the polymer brush regions; and etching the organic planarization layer, inward of the intermediate regions, to provide a plurality of organic planarization layer pillars in the organic planarization layer. The organic planarization layer pillars define a plurality of organic planarization layer trenches in the organic planarization layer, and the organic planarization layer trenches are inverted with respect to the photoresist pillars. The polymer brush is also removed during the etch of the organic planarization layer.

According to another embodiment of the present invention, another exemplary method includes providing an initial semiconductor structure including an underlying substrate, a hard mask stack outward of the underlying substrate, an organic planarization layer outward of the hard mask stack, a first complementary material outward of the organic planarization layer, a second complementary material outward of the first complementary material, wherein the second complementary material is preferentially etchable with respect to the first complementary material, and a patterned photoresist layer outward of the second complementary material, wherein the patterned photoresist layer is patterned into a plurality of photoresist pillars defining a plurality of photoresist trenches. Further steps include etching the second complementary material and partially etching the first complementary material, inward of the photoresist trenches, to provide first complementary material-second complementary material trench regions in the second complementary material and the first complementary material, with first complementary material-second complementary material pillar regions intermediate the first complementary material-second complementary material trench regions; removing the patterned photoresist layer; and grafting a polymer brush on the first complementary material-second complementary material trench regions but not the first complementary material-second complementary material pillar regions. Even further steps include etching the first complementary material-second complementary material pillar regions but not the first complementary material-second complementary material trench regions with the polymer brush; and etching the organic planarization layer, inward of the first complementary material-second complementary material pillar regions, to provide a plurality of organic planarization layer pillars in the organic planarization layer. the organic planarization layer pillars define a plurality of organic planarization layer trenches in the organic planarization layer. the organic planarization layer trenches are inverted with respect to the photoresist pillars. the polymer brush is also removed during the etch of the organic planarization layer.

According to still another embodiment of the present invention, still another exemplary method includes providing an initial semiconductor structure including an underlying substrate, a hard mask stack outward of the underlying substrate, an organic planarization layer outward of the hard mask stack, a first complementary material outward of the organic planarization layer, and a patterned photoresist layer outward of the first complementary material, wherein the patterned photoresist layer is patterned into a plurality of photoresist pillars defining a plurality of photoresist trenches. Further steps include partially etching the first complementary material inward of the trenches, to provide first complementary material trench regions in the first complementary material; removing the patterned photoresist layer; and filling the trench regions in the first complementary material with a second complementary material, wherein the second complementary material is preferentially etchable with respect to the first complementary material. Still further steps include selectively depositing a third complementary material on the second complementary material to form a plurality of third complementary material-covered regions and a plurality of intermediate regions not covered with the third complementary material, wherein the third complementary material is selected to grow selectively on the second complementary material but not directly on the first complementary material, and wherein the third complementary material is preferentially etchable with respect to the first complementary material; anisotropically etching the first complementary material inward of the intermediate regions but not inward of the third complementary material-covered regions; and etching the organic planarization layer, inward of the intermediate regions, to provide a plurality of organic planarization layer pillars in the organic planarization layer. The organic planarization layer pillars define a plurality of organic planarization layer trenches in the organic planarization layer, and the organic planarization layer trenches are inverted with respect to the photoresist pillars.

Techniques of the present invention can provide substantial beneficial technical effects. For example, one or more embodiments provide reduced defects in lithographic printing of features during semiconductor fabrication and/or enhanced control of critical dimensions during semiconductor fabrication.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of several illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments enable the use of direct print EUV (Extreme Ultraviolet) lithography for printing pillars and/or for inverting the tone for trench patterning. As noted above, there are a number of issues with regard to the current state of the art. Due to the small sizes and "brightfield" nature of the lithography, printing pillars with a positive-tone resist in EUV leads to unacceptably-high pattern distortion, number of defects, and collapse. Furthermore, direct print of a trench in the sub-32 nm-pitch regime has process limitations due to resist scumming that forms microbridges. One or more embodiments advantageously invert the tone so as to widen the process window by incorporating the bridges in the masked area. Heretofore, non-selective tone-inversion schemes have suffered from pattern density and size dependency.

One or more embodiments provide a new process flow for tone inversion which focuses on the reinforcement of the exposed hardmask (HM). A first non-limiting exemplary embodiment (FIGS. 1-7 with alternative in FIG. 8) employs selective grafting of a polymer to reinforce tone inversion etch in a dual HM scheme. A second non-limiting exemplary embodiment (FIGS. 1-4, same for both embodiments, and FIGS. 9-11) employs selective deposition of a top film.

Figure 1:
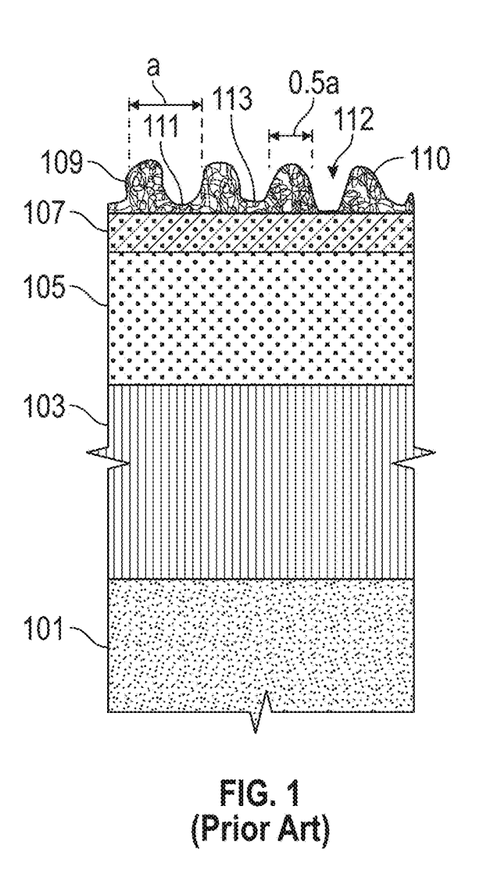
FIG. 1 is a side cross-sectional view of a starting structure, according to the prior art, which serves as a starting point in a semiconductor fabrication process in accordance with both first and second exemplary embodiments.

Referring now to FIG. 1, an exemplary materials stack includes ultra-low conductivity material (ULK) 101; a ULK hard mask stack 103 including, e.g., Tetraethyl orthosilicate (TEOS), TiN, and sacrificial SiN; an organic planarization layer 105; an amorphous silicon layer 107, and a resist layer 109 that has been directly patterned with EUV. The pattern has a feature width a, with pillars 110 of width 0.5a, and intermediate trenches 112 of width 0.5a (width of trenches not labeled to avoid clutter). There is a lack of uniformity in the patterns, resulting in defects. All the trenches in the resist 109 do not run all the way down to the amorphous silicon layer 107, resulting in nano-bridges at 111, 113. There are also variations in the height of the resist 109, which may cause line break. In one or more embodiments, patterning is carried out at or close to a 1:1 duty cycle. Note that the skilled artisan will be familiar with the fabrication of structures such as depicted in FIG. 1. In a non-limiting example, the thickness of the a-Si can be about 10-15 nm.

Figure 2:
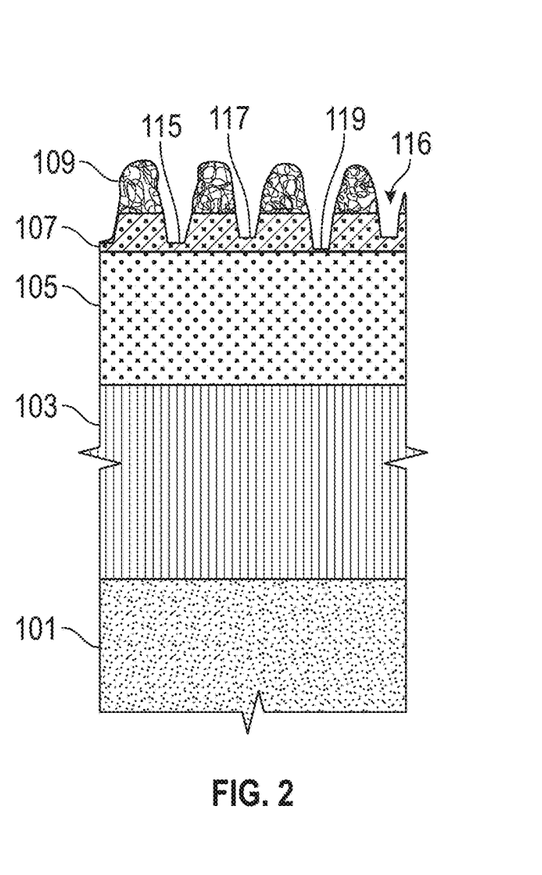
FIG. 2 is a side cross-sectional view of the structure of FIG. 1 after a partial etch, in accordance with both the first and second exemplary embodiments.

Referring now to FIG. 2, one or more embodiments break through the resist 109 and begin etching the amorphous silicon 107 to provide amorphous silicon trench regions 116. Bridges may form in the amorphous silicon, as seen at 115, 117. In particular, one or more embodiments employ a first, de-scum etch; e.g., an $HBr/O_2$ etch—this etch attacks the resist and also starts etching into the underlying a-Si 107. An $Ar/O_2$ etch could also be used. The first etch is employed, in one or more embodiments, until the thickest bridge (e.g. 113 in FIG. 1) in the resist has been etched through. One or more embodiments then further employ a second etch to attack the a-Si; for example, $CHF_3/C_4F_8$ chemistry, resulting in the structure shown in FIG. 2, wherein the resist has been etched completely through in the trenches while the amorphous silicon has in some locations (e.g. 119) etched completely away while in other locations (e.g. 115, 117) bridges remain. In one or more embodiments, the a-Si thickness/etch chemistry is optimized to ensure that the bridge height in the a-Si is less than the total thickness of the a-Si.

Note that in alternative embodiments, an additional organic layer can be provided between layers 107 and 109. If such is present, it should also be etched away at this point, such that each trench 116 extends into the a-Si layer 107.

Figure 3:
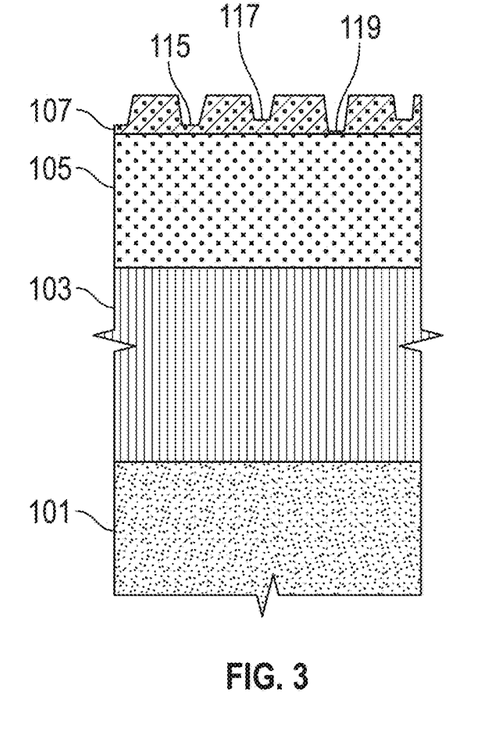
FIG. 3 is a side cross-sectional view of the structure of FIG. 2 after resist ashing, in accordance with both the first and second exemplary embodiments.

FIG. 3 shows the structure after ashing the resist 109 and any other organic material so that only trenches in the inorganic material (a-Si 107) remain. The heights of the trenches in the a-Si 107 vary.

Figure 4:
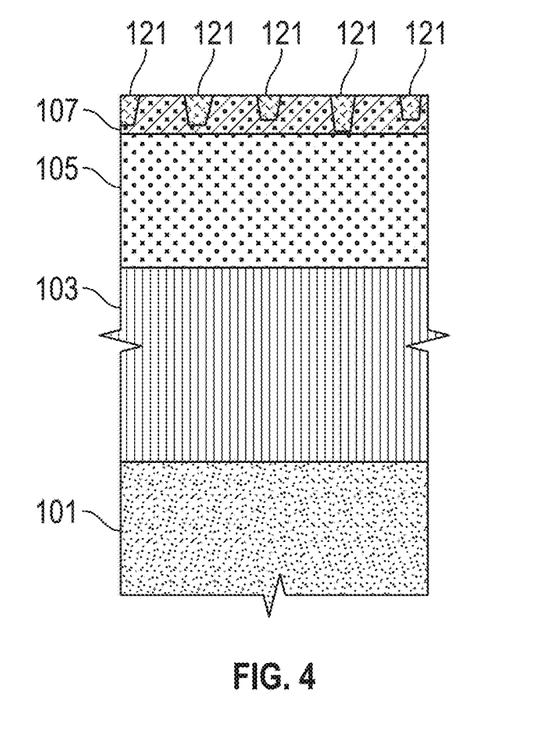
FIG. 4 is a side cross-sectional view of the structure of FIG. 3 after oxide deposition, in accordance with both the first and second exemplary embodiments.

In FIG. 4, the trenches in the a-Si 107 are filled with an oxide material 121. Non-limiting examples of accomplishing this aspect include deposition and etch-back of flowable oxide; note that atomic layer deposition (ALD) of oxide can also be used. The oxide can be applied to fill the trenches and extend over an outer surface of the a-Si layer and then be etched back via an atomic layer etching (ALE) or quasi-ALE process which provides high selectivity for better stopping on the a-Si layer 107. Some embodiments employ, for example, $C_4F_8$ or $CF_4$ based chemistry for etch-back of the oxide; in some cases, selectivity to a-Si may have limited pertinence since the a-Si is sacrificial.

Figure 5:
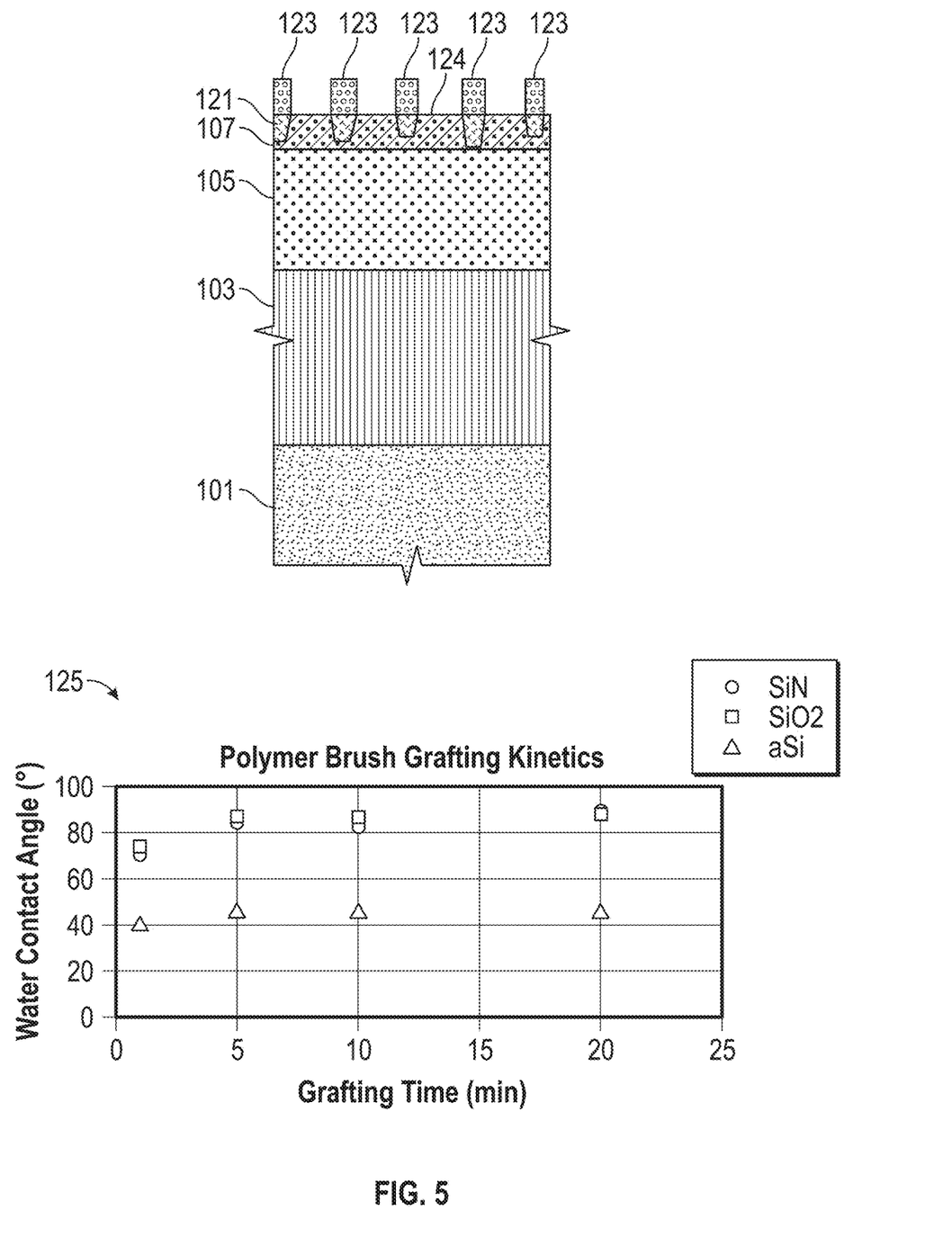
FIG. 5 is a side cross-sectional view of the structure of FIG. 4 after polymer brush grafting, in accordance with the first exemplary embodiment.

Referring now to FIG. 5, one or more embodiments advantageously carry out selective polymer grafting on the gap-fill oxide regions 121, as seen at 123. The grafted material 123 is distinct from the a-Si material. The grafted material 123 is selected to graft to the oxide regions 121 but not the a-Si 107, thus forming polymer brush regions 123 with intermediate regions 124 of amorphous silicon not covered by the polymer brush. As seen in graph 125 in FIG. 5, an organic material can be successfully selectively grafted to SiN and $SiO_2$, but will not graft significantly to the a-Si. One or more non-limiting exemplary embodiments employ a DHF (dilute Hydrofluoric acid) wet clean followed by selective polymer grafting. Spin-on selective polymer brush grafting on the oxide enhances etch selectivity. Polymer brushes with phosphonic acids/glycerol end groups will graft selectively to oxide/nitride (which are terminated with —OH functionality) vs. a-Si (—H terminated).

Figure 6:
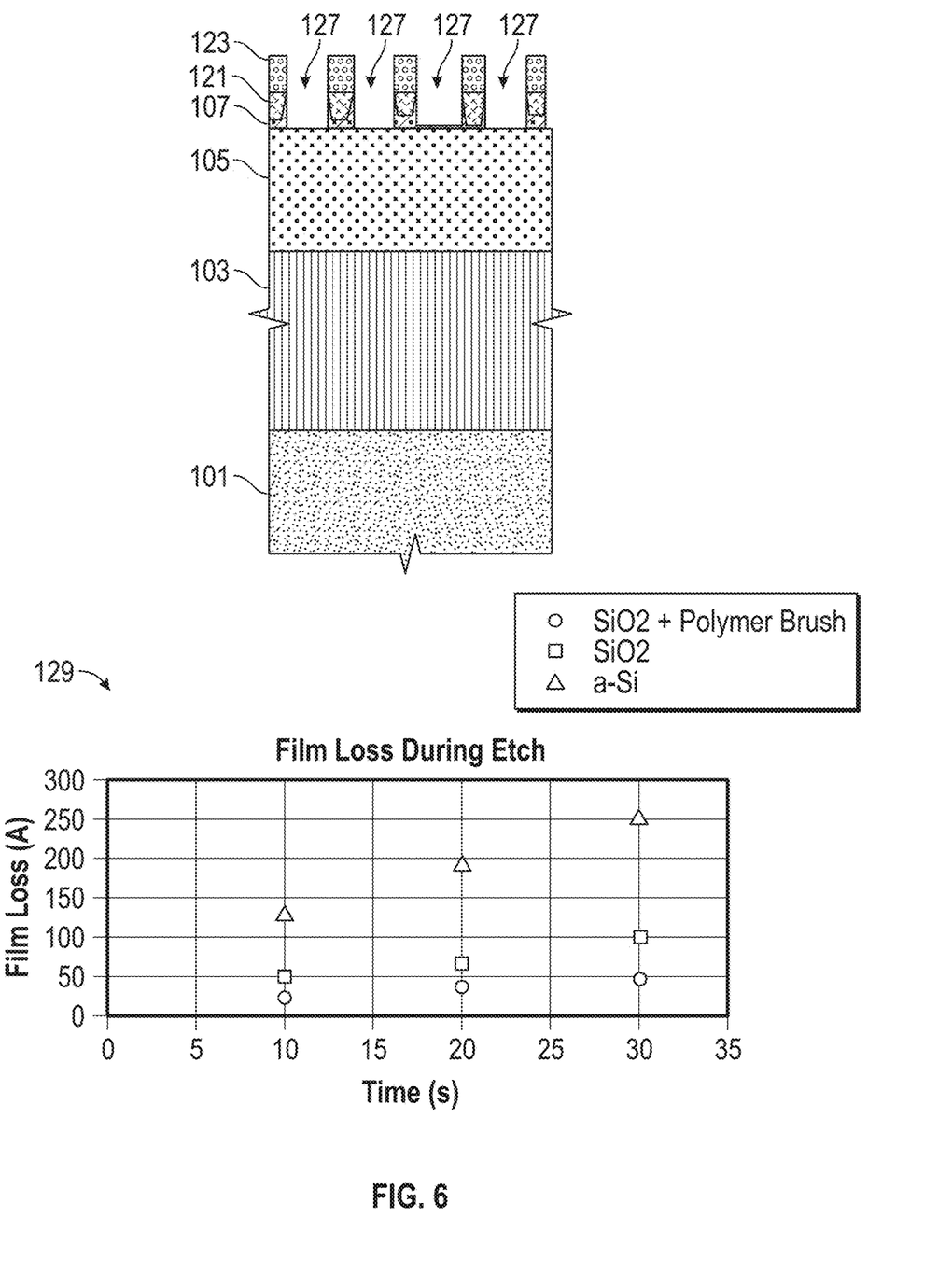
FIG. 6 is a side cross-sectional view of the structure of FIG. 5 after anisotropic etching, in accordance with the first exemplary embodiment, also including a plot of film loss as a function of time during etching.

FIG. 6 shows an anisotropic a-Si etch carried out to remove the a-Si 107 in regions 127 (corresponding to the intermediate regions 124) not protected by the oxide 121 and polymer brush 123. Having the protecting polymer selectively on the oxide reinforces the removal of a-Si without any gouging at this length scale (etch selectivity is enhanced). The a-Si etch can be carried out, for example, with $CHF_3/CF_4$ chemistry. As seen in graph 129 in FIG. 6, the film loss in Angstroms as a function of time in seconds is minimal for the $SiO_2$+polymer brush and $SiO_2$ regions, but significant for the a-Si regions.

Figure 7:
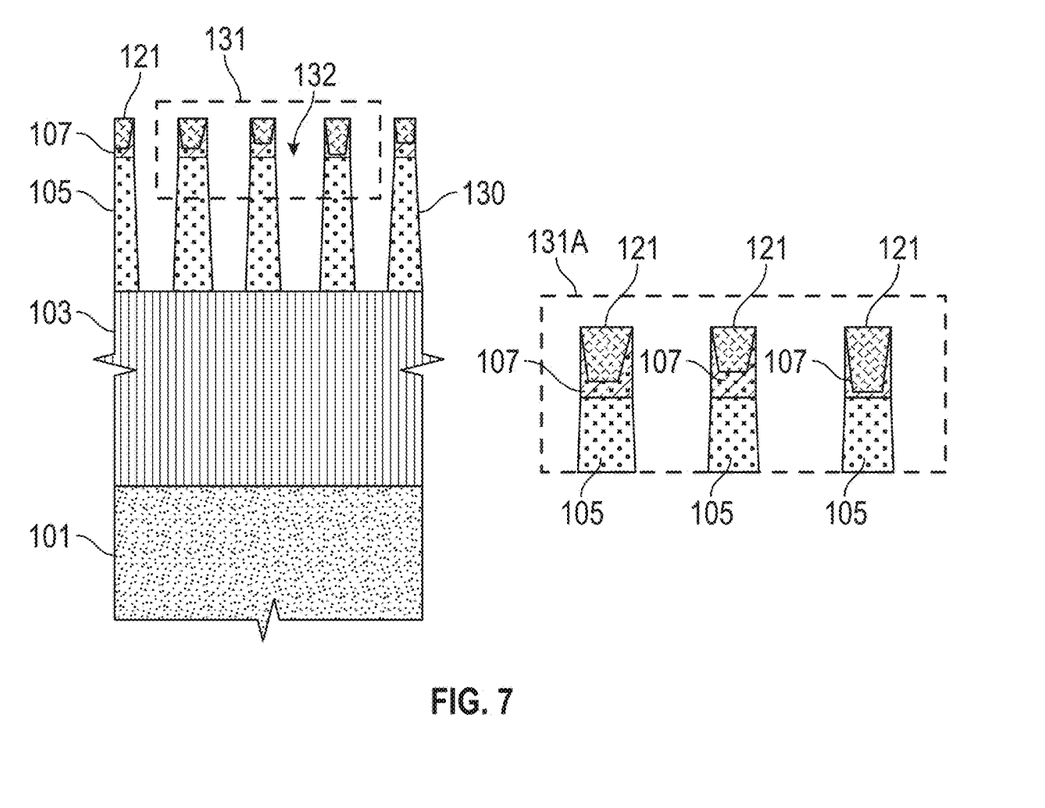
FIG. 7 is a side cross-sectional view of the structure of FIG. 6 after organic planarization layer (OPL) etching, in accordance with the first exemplary embodiment.

FIG. 7 shows further etching into the OPL 105. A partial enlargement of region 131 is shown at 131A. The polymer brush portion is removed during the OPL etch, since the chemical compositions are similar. The etching provides a plurality of organic planarization layer pillars 130 defining a plurality of organic planarization layer trenches 132.

Figure 8:
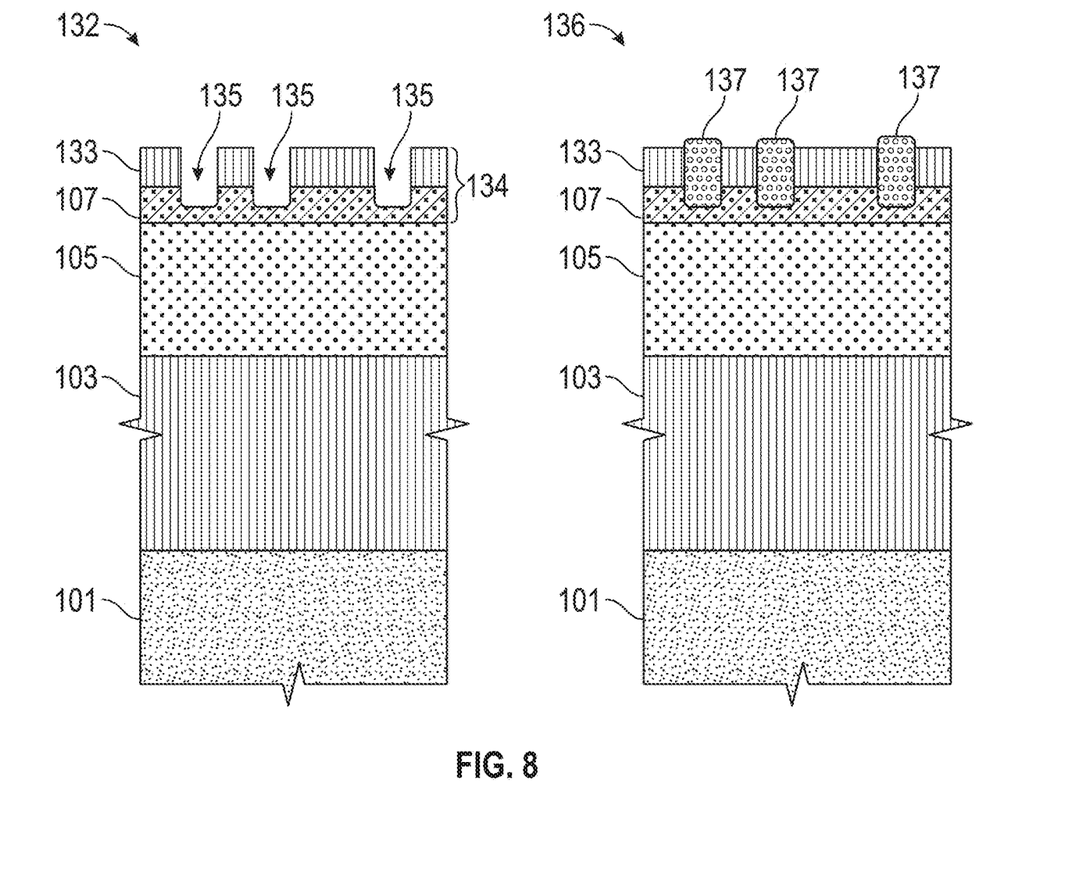
FIG. 8 shows side cross-sectional views of an alternative approach to the first exemplary embodiment, with an over-etch and selective grafting.

FIG. 8 shows a variation of the first embodiment. Layers 101, 103, 105, and 107 are generally similar to those described above. However, above the a-Si 107, another inorganic layer 133 is provided (e.g., SiN), rather than having the resist right on top of the a-Si. Referring first to view 132 in FIG. 8, in this case, etch through the nitride 133 first and then into the a-Si 107. The resulting trenches 135 may have an equal or unequal depth into the a-Si layer 107. View 132 thus depicts etching the nitride 133 and partially etching the amorphous silicon 107, inward of the photoresist trenches, to provide nitride-amorphous silicon trench regions 135 in the nitride and the amorphous silicon layer, with nitride-amorphous silicon pillar regions 134 intermediate the nitride-amorphous silicon trench regions.

Then, referring to view 136, selectively coat a polymer brush 137 only on the exposed a-Si 107 and not on the nitride 133. The same selective chemistries between SiN and a-Si can be employed as discussed above. However, instead of an overall deposit and etch-back to invert the tone, as above, here, selectively deposit on the exposed a-Si trenches and not on the nitride at the top. The process can then continue with etching as above to invert the tone. View 136 in FIG. 8 of the "variation" first embodiment corresponds to FIGS. 4 and 5 in the "main" first embodiment. In FIG. 4, deposit the oxide 121 and etch it back till it is flush with the a-Si 107, then polymer brush 123 on the oxide in FIG. 5. In FIG. 8, directly polymer brush on top of the a-Si 107. The other part remains open and instead of grafting on the gap fill material, graft on the open hard mask area. One or more embodiments employ brushes with grafting selective to oxide/nitride vs a-Si, or vice-versa. One or more embodiments over-etch into the bottom dielectric film, with selective grafting to the bottom dielectric film.

One pertinent aspect in one or more embodiments is the use of a selective grafting material to invert the tone. This can be done at the locations where the material has been opened or gap filling can be employed.

Figure 9:
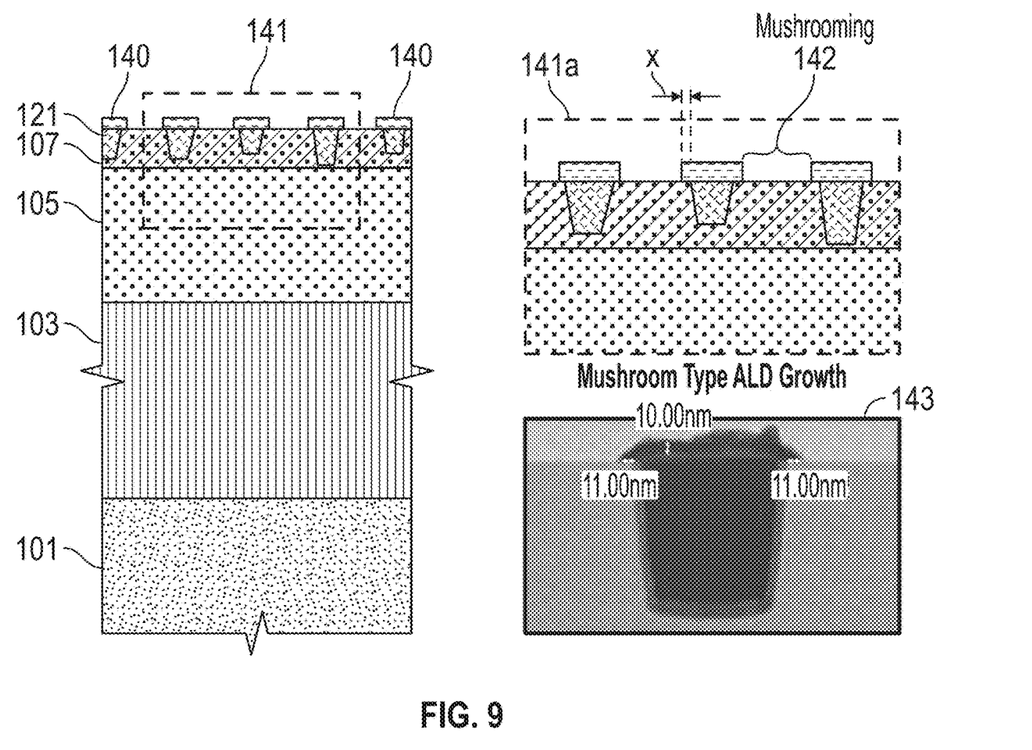
FIG. 9 is a side cross-sectional view of the structure of FIG. 4 after selective nitride deposition, in accordance with the second exemplary embodiment, also depicting details of a "mushrooming" aspect.

A second embodiment uses steps similar to those illustrated in FIGS. 1-4. Then, referring to FIG. 9, selective ALD 140 (e.g., of nitride) is carried out over the oxide regions 121. Nucleation occurs over the oxide regions 121 but not the a-Si 107. Mushrooming or overgrowth occurs during selective deposition as shown schematically at 141A (enlargement of 141) and in a micrograph at 143. The lateral extent of the mushrooming is labeled as "x" in view 141A while exemplary actual dimensions (11 nm lateral, 10 nm vertical extent) are shown in view 143. Other embodiments could have other values. FIG. 9 thus depicts selectively depositing nitride on the oxide to form a plurality of nitride-covered regions 140 and a plurality of intermediate regions 142 not covered with the nitride. An additional control over critical dimension (CD) is thus available via the overgrowth, which can be used to control the width by controlling the number of cycles of ALD. The width/critical dimension can be increased by twice the overgrowth x (since overgrowth extends on each side). One or more embodiments employ a DHF wet clean followed by selective deposition (selective ALD of nitride 140 on oxide 121). The extent of mushrooming can be precisely controlled in one or more embodiments by controlling the number of ALD cycles. As is known to the skilled artisan, selective deposition can distinguish between $SiO_2$ vs. a-Si based on surface hydrophobicity.

Figure 10:
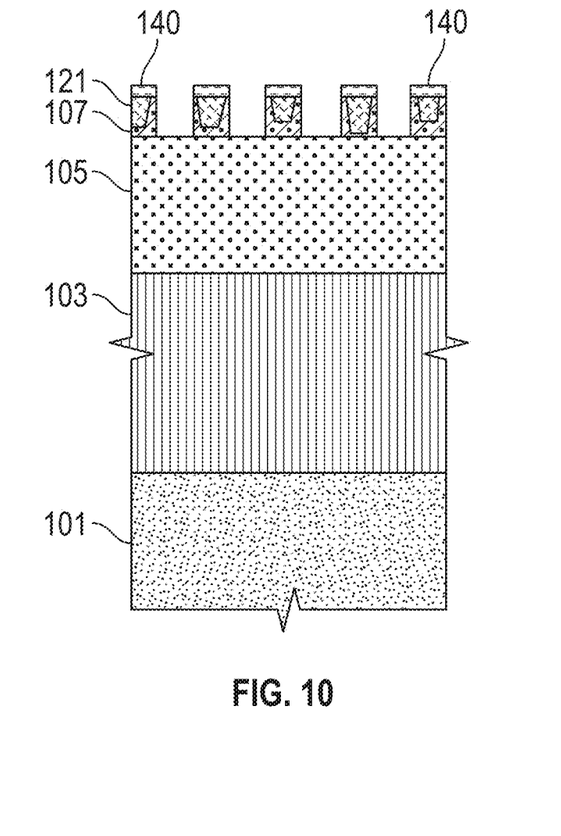
FIG. 10 is a side cross-sectional view of the structure of FIG. 9 after an anisotropic etch, in accordance with the second exemplary embodiment, also depicting details of a "mushrooming" aspect.
Figure 11:
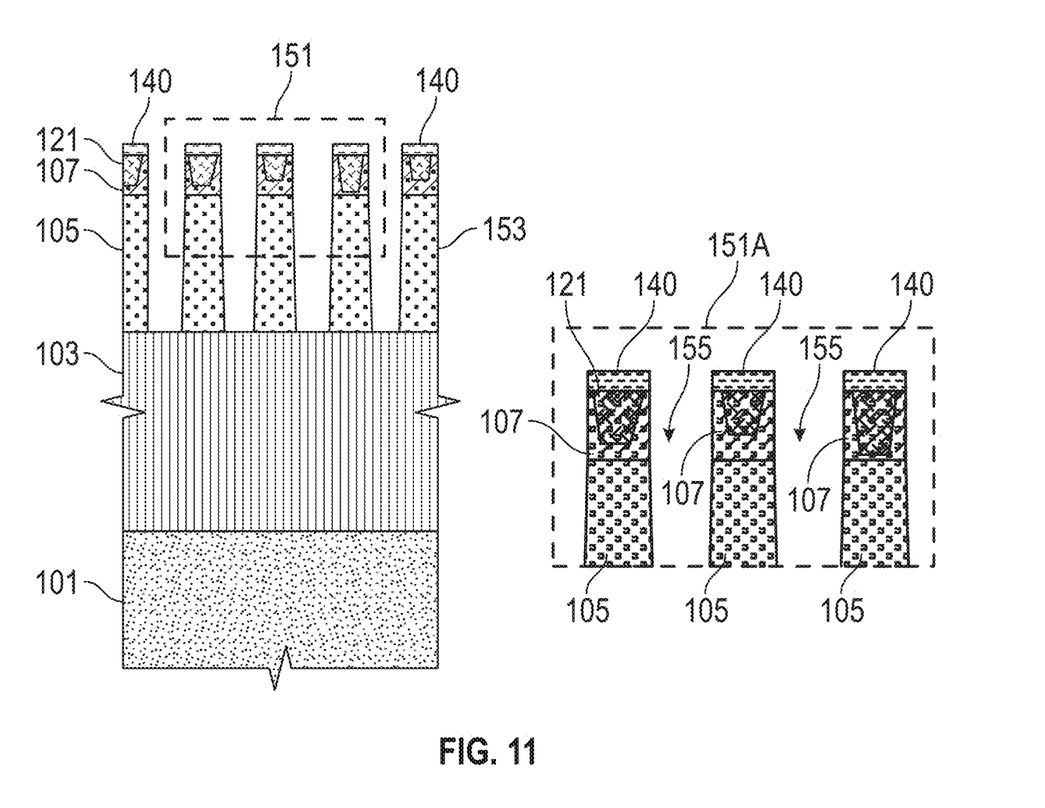
FIG. 11 is a side cross-sectional view of the structure of FIG. 10 after organic planarization layer (OPL) etching, in accordance with the second exemplary embodiment.

As seen in FIG. 10, carry out an anisotropic etch of the a-Si 107 which is reinforced by the selectively formed top surface (nitride 140); the a-Si between the nitride regions is etched away down to the OPL 105. Suitable chemistry for the a-Si etch includes, e.g., HBr or $Cl_2$-based chemistry selective to nitride/oxide. As seen in FIG. 11, etch the OPL 105 down to the ULK hard mask stack 103. Region 151A is an enlargement of region 151. FIG. 11 thus depicts etching the organic planarization layer, inward of the intermediate regions 142, to provide a plurality of organic planarization layer pillars 153 in the organic planarization layer; the organic planarization layer pillars define a plurality of organic planarization layer trenches 155.

One or more embodiments use a sacrificial organic layer to reverse the lithography tone to create pillars, as opposed to using a sacrificial organic layer for pitch doubling. One or more embodiments provide a new process flow for tone inversion which focuses on the reinforcement of the exposed hardmask (HM). Some embodiments employ selective grafting of a polymer to reinforce tone inversion etch in a dual HM scheme. Some embodiments employ selective deposition of a top film.

One or more embodiments provide a method to invert the tone during pattern transfer through the top hardmask of a lithography stack, where the hardmask is reinforced by a preferentially grafted organic material 123, 137 that enables thickness scaling of the hardmask film for defect-free pattern transfer.

One or more embodiments provide a method to invert the tone during pattern transfer through the top hardmask of a lithography stack, where the hardmask is reinforced by a preferentially deposited inorganic material 140 that enables thickness scaling of the hardmask film for defect-free pattern transfer. In some such embodiments, mushroom-type selective deposition of the inorganic hardmask is used to control the critical dimension of the pattern.

It will be appreciated that materials other than those described herein can be employed in inverse tone pillar printing.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching are well understood by those skilled in the art and, as such, a more detailed description of such processes is not presented herein.

Although the overall fabrication method is novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more layers of a type commonly used in such integrated circuit devices may not be explicitly shown in a given figure for ease of explanation. This does not imply that the layer(s) not explicitly shown are omitted in the actual integrated circuit device.

Given the discussion thus far, it will be appreciated that, in general terms, an exemplary method, according to an aspect of the invention, includes the step (see FIG. 1) of providing an initial semiconductor structure including an underlying substrate 101, a hard mask stack 103 outward of the underlying substrate, an organic planarization layer 105 outward of the hard mask stack, a first complementary material (e.g., amorphous silicon layer 107) outward of the organic planarization layer, and a patterned photoresist layer 109 outward of the first complementary material. The patterned photoresist layer is patterned into a plurality of photoresist pillars 110 defining a plurality of photoresist trenches 112. A further step, as seen in FIG. 2, includes partially etching the first complementary material inward of the trenches, to provide first complementary material trench regions 116 in the first complementary material. A still further step, as seen in FIG. 3, includes removing the patterned photoresist layer. An even further step, as seen in FIG. 4, includes filling the trench regions in the first complementary material with a second complementary material (e.g. oxide 121). In general, the first and second complementary materials can be any two materials with different etch selectivity; e.g., amorphous silicon and silicon nitride or other material pairs apparent to the skilled artisan—an etchant that works on material 107 should not work on material 121 and vice versa.

It is worth noting that the substrate 101 can include, for example, a dielectric such as a low-k dielectric having a value of 2.4 or 2.7, or a mix of different dielectric layers, outward of a base silicon substrate (omitted from the figure to avoid clutter).

An additional step, as seen in FIG. 5, includes grafting a polymer brush on the second complementary material but not the first complementary material, to form polymer brush regions 123 with intermediate regions 124 of first complementary material not covered by the polymer brush. Another step, as seen in FIG. 6, includes anisotropically etching the first complementary material at the intermediate regions but not the polymer brush regions. Still another step, as seen in FIG. 7, includes etching the organic planarization layer, inward of the intermediate regions 124, to provide a plurality of organic planarization layer pillars 130 in the organic planarization layer. The organic planarization layer pillars define a plurality of organic planarization layer trenches 132 in the organic planarization layer. The organic planarization layer trenches are inverted with respect to the photoresist pillars. The polymer brush is also removed during the etch of the organic planarization layer, in one or more embodiments.

Thus, in one or more embodiments, the pattern in the OPL is inverted with respect to the pattern in the photoresist. For example, the closed area (pillar) in the photoresist becomes the trench in the OPL and can be printed at the critical dimension and defect free. In some cases, the organic planarization layer trenches and the organic planarization layer pillars are inverted with respect to the photoresist pillars and the photoresist trenches.

As noted, in some instances, the first complementary material includes amorphous silicon and the second complementary material includes one of oxide and silicon nitride.

In a non-limiting example, in the providing step, the photoresist pillars and the photoresist trenches have similar widths. For example, each may have a width of 0.5a, where the pitch a is less than or equal to 40 nm.

In one or more embodiments, in the providing step, the underlying substrate includes an ultra-low-conductivity layer 101.

In a non-limiting example, in the providing step, the hard mask stack 103 includes TEOS, TiN, and sacrificial SiN.

In some cases, in the providing step, the amorphous silicon has a thickness of from 10 to 15 nanometers.

In one or more embodiments, the partial etching of the amorphous silicon is carried out such that bridges of amorphous silicon (FIG. 2 115, 117) remaining in at least a portion of the trench regions in the amorphous silicon have a height less than a total thickness of the amorphous silicon.

In some cases, the partial etching of the amorphous silicon includes a descum etch followed by an amorphous-silicon-specific etch.

Some embodiments further include patterning the photoresist layer, to provide the patterned photoresist layer, using Extreme Ultraviolet (EUV) lithography. As will be appreciated by the skilled artisan, Extreme ultraviolet lithography (also known as EUV or EUVL) is a next-generation lithography technology using an extreme ultraviolet (EUV) wavelength on the order of 13.5 nm. One or more embodiments help to address the limitations of stochastic defects in EUV, specifically, the microbridges, and invert the tone to shrink the pitch and carry out inverse tone patterning.

Some embodiments even further include transferring a pattern including the organic planarization layer pillars and the organic planarization layer trenches into the underlying substrate and metallizing same.

Furthermore, given the discussion thus far, it will be appreciated that, in general terms, another exemplary method, according to another aspect of the invention, includes the step (refer to FIG. 1 and FIG. 8 view 132) of providing an initial semiconductor structure including an underlying substrate 101, a hard mask stack 103 outward of the underlying substrate, an organic planarization layer 105 outward of the hard mask stack, a first complementary material (e.g. amorphous silicon layer 107) outward of the organic planarization layer, a second complementary material (e.g. nitride layer 133 (omitted from FIG. 1 for illustrative brevity, seen post-etch in FIG. 8 view 132)) outward of the first complementary material, and a patterned photoresist layer 109 outward of the second complementary material. The second complementary material is preferentially etchable with respect to the first complementary material. The patterned photoresist layer is patterned into a plurality of photoresist pillars 110 defining a plurality of photoresist trenches 112. Patterning and lithography per se are well-known to the skilled artisan and the skilled artisan will be able to implement embodiments of the invention given the teachings herein). Further regarding the first and second complementary materials such as 107, 133, amorphous silicon and silicon nitride are non-limiting examples. Other examples include a silicon oxide layer and a metal oxide layer, a silicon nitride layer and a metal oxide layer, or a silicon nitride layer and a silicon carbide layer (in the case where the latter two materials provided adequate selectivity). Furthermore, in one or more embodiments, the polymer brush can be tailored to attach to the preferred surface accordingly.

A further step, referring to FIG. 2 and FIG. 8 view 132, includes etching the second complementary material and partially etching the first complementary material, inward of the photoresist trenches, to provide first complementary material-second complementary material (e.g. nitride-amorphous silicon) trench regions 135 in the second complementary material and the first complementary material, with first complementary material-second complementary material (e.g. nitride-amorphous silicon) pillar regions 134 intermediate the first complementary material-second complementary material trench regions. A still further step, as seen in FIG. 3, includes removing the patterned photoresist layer. An even further step, as seen in FIG. 8 view 136, includes grafting a polymer brush 137 on the first complementary material-second complementary material trench regions but not the first complementary material-second complementary material silicon pillar regions.

Still a further step includes etching (typically, an anisotropic etch) the first complementary material-second complementary material pillar regions 134 but not the first complementary material-second complementary material trench regions with the polymer brush 137. Pattern transfer etching is well-known; etching, e.g., silicon nitride with respect to an organic material is also well-known and the skilled artisan will be able to implement embodiments of the invention given the teachings herein. Yet a further step includes etching the organic planarization layer, inward of the first complementary material-second complementary material pillar regions 134, to provide a plurality of organic planarization layer pillars in the organic planarization layer. The organic planarization layer pillars define a plurality of organic planarization layer trenches in the organic planarization layer. The process just described is analogous to that depicted in FIGS. 6 and 7, with the pillars forming under the polymer brush and the trenches therebetween. In one or more embodiments, the organic planarization layer trenches are inverted with respect to the photoresist pillars; refer generally to the above discussion of pattern inversion. Here again, "inverted" refers to the closed area (pillar) becoming the trench which can be printed at the critical dimension and defect free. The polymer brush is also removed during the etch of the organic planarization layer, analogously to FIG. 7.

One pertinent aspect of one or more embodiments is that different trench heights in a layer such as an amorphous silicon layer or similar layer, which occur due to defects, are not transferred into the underlying substrate, because of the tone inversion.

As discussed, in a non-limiting example, the first complementary material includes amorphous silicon and the second complementary material includes nitride. Some embodiments further include patterning the photoresist layer, to provide the patterned photoresist layer, using Extreme Ultraviolet (EUV) lithography. Some embodiments still further include transferring a pattern including the organic planarization layer pillars and the organic planarization layer trenches into the underlying substrate and metallizing same.

In some instances, in the providing step, the photoresist pillars and the photoresist trenches have similar widths. Furthermore, in some instances, in the providing step, the underlying substrate includes an ultra-low-conductivity layer.

Even further, given the discussion thus far, it will be appreciated that, in general terms, still another exemplary method, according to still another aspect of the invention, includes the step (see FIG. 1) of providing an initial semiconductor structure including an underlying substrate 101, a hard mask stack 103 outward of the underlying substrate, an organic planarization layer 105 outward of the hard mask stack, a first complementary material (e.g., amorphous silicon layer 107) outward of the organic planarization layer, and a patterned photoresist layer 109 outward of the first complementary material. The patterned photoresist layer is patterned into a plurality of photoresist pillars 110 defining a plurality of photoresist trenches 112. A further step, as seen in FIG. 2, includes partially etching the first complementary material inward of the trenches, to provide first complementary material trench regions 116 in the first complementary material. A still further step, as seen in FIG. 3, includes removing the patterned photoresist layer. An even further step, as seen in FIG. 4, includes filling the trench regions in the first complementary material with second complementary material (e.g. oxide 121).

Yet a further step, referring to FIG. 9, includes selectively depositing a third complementary material (e.g. nitride) on the second complementary material to form a plurality of third complementary material-covered regions 140 and a plurality of intermediate regions 142 not covered with the third complementary material. The third complementary material is selected to grow selectively on the second complementary material but not directly on the first complementary material, and the third complementary material is preferentially etchable with respect to the first complementary material. Thus, the third complementary material should be able to selectively grow on the material in the trenches and overspread to the side but not grow directly on the material 107 and should also etch differently than the material 107; non-limiting examples include a nitride (e.g. silicon nitride or a metal nitride) or metal oxide in contrast to amorphous silicon.

Another step includes anisotropically etching the first complementary material inward of the intermediate regions but not inward of the third complementary material-covered regions, as seen in FIG. 10. Referring to FIG. 11, still another step includes etching the organic planarization layer, inward of the intermediate regions 142, to provide a plurality of organic planarization layer pillars 153 in the organic planarization layer. The organic planarization layer pillars define a plurality of organic planarization layer trenches 155 in the organic planarization layer. In one or more embodiments, the organic planarization layer trenches are inverted with respect to the photoresist pillars; refer generally to the above discussion of pattern inversion. Here again, "inverted" refers to the closed area (pillar) becoming the trench which can be printed at the critical dimension and defect free.

As noted, in a non-limiting example, the first complementary material includes amorphous silicon, the second complementary material includes oxide, and the third complementary material includes nitride.

Referring to views 141A and 143 of FIG. 9, in some cases, in the step of selectively depositing the nitride, the nitride is deposited such that the nitride-covered regions overlap the oxide.

Referring to view 143 of FIG. 9, in some cases, in the step of selectively depositing the nitride, the nitride is deposited such that the nitride-covered regions overlap the oxide by about 11 nanometers and extend above the oxide by about 10 nanometers.

In one or more embodiments, selectively depositing the third complementary material on the second complementary material includes carrying out atomic layer deposition of the third complementary material to control the critical dimension (CD). Indeed, the extent of mushrooming can be precisely controlled by controlling the number of ALD cycles, and mushroom-type selective deposition of the inorganic hardmask is used in one or more embodiments to control the critical dimension of the pattern. In one or more embodiments, mushrooming is accounted for when the pattern transfer is carried out; the mushroom cap region defines the line edge, sets the width of the pillars and therefor indirectly sets the width of the trenches; thus, it controls the CD.

Some embodiments further include patterning the photoresist layer, to provide the patterned photoresist layer, using Extreme Ultraviolet (EUV) lithography. Some embodiments still further include transferring a pattern including the organic planarization layer pillars and the organic planarization layer trenches into the underlying substrate and metallizing same.

In some instances, in the providing step, the photoresist pillars and the photoresist trenches have similar widths. Furthermore, in some instances, in the providing step, the underlying substrate includes an ultra-low-conductivity layer.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having transistors therein formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this invention is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" or adjoining another layer, it will be understood that there may or may not be intermediate elements or layers between the two specified layers. If a layer is described as "directly on" another layer, direct contact of the two layers is indicated.

The corresponding structures, materials, acts, and equivalents of means or step-plus-function elements, if any, in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical invention. It is submitted with the understanding that it will not be used to interpret or limit the scope or meaning of the claims. In addition, in the foregoing Detailed Description, it can be seen that various features are grouped together in a single embodiment for the purpose of streamlining the invention. This method of invention is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
providing an initial semiconductor structure including an underlying substrate, a hard mask stack outward of the underlying substrate, an organic planarization layer outward of the hard mask stack, a first complementary material outward of the organic planarization layer, and a patterned photoresist layer outward of the first complementary material, wherein the patterned photoresist layer is patterned into a plurality of photoresist pillars defining a plurality of photoresist trenches;
partially etching said first complementary material inward of said trenches, to provide first complementary material trench regions in said first complementary material;
removing said patterned photoresist layer;
filling said trench regions in said first complementary material with a second complementary material, wherein said second complementary material is preferentially etchable with respect to said first complementary material;
selectively depositing a third complementary material on said second complementary material to form a plurality of third complementary material-covered regions and a plurality of intermediate regions not covered with said third complementary material, wherein said third complementary material is selected to grow selectively on said second complementary material but not directly on said first complementary material, and wherein said third complementary material is preferentially etchable with respect to said first complementary material;
anisotropically etching said first complementary material inward of said intermediate regions but not inward of said third complementary material-covered regions; and
etching said organic planarization layer, inward of said intermediate regions, to provide a plurality of organic planarization layer pillars in said organic planarization layer, said organic planarization layer pillars defining a plurality of organic planarization layer trenches in said organic planarization layer, said organic planarization layer trenches being inverted with respect to said photoresist pillars.

2. The method of claim 1, wherein said first complementary material comprises amorphous silicon, said second complementary material comprises oxide, and said third complementary material comprises nitride.

3. The method of claim 2, wherein, in said step of selectively depositing said nitride, said nitride is deposited such that said nitride-covered regions overlap said oxide.

4. The method of claim 3, wherein, in said step of selectively depositing said nitride, said nitride is deposited such that said nitride-covered regions extend above said oxide.

5. The method of claim 4, wherein, in said step of selectively depositing said nitride, said nitride is deposited such that said nitride-covered regions overlap said oxide by 11 nanometers and extend above said oxide by 10 nanometers.

6. The method of claim 3, wherein selectively depositing said third complementary material on said second complementary material comprises carrying out atomic layer deposition of said third complementary material to control critical dimension.

7. The method of claim 6, further comprising transferring a pattern comprising said organic planarization layer pillars and said organic planarization layer trenches into said underlying substrate and metallizing same.

8. The method of claim 2, wherein, in said providing step, said photoresist pillars and said photoresist trenches have similar widths.

9. The method of claim 8, wherein, in said providing step, said underlying substrate comprises an ultra-low-conductivity layer.

* * * * *